(12) United States Patent
Fujii et al.

(10) Patent No.: US 6,956,729 B2
(45) Date of Patent: Oct. 18, 2005

(54) CAPACITOR ELEMENT AND PRODUCTION THEREOF

(75) Inventors: Eiji Fujii, Ibaraki (JP); Toyoji Ito, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/636,794

(22) Filed: Aug. 7, 2003

(65) Prior Publication Data

US 2004/0027786 A1 Feb. 12, 2004

(30) Foreign Application Priority Data

Aug. 7, 2002 (JP) ......................................... 2002-230479

(51) Int. Cl.[7] .......................... H01G 4/005; H01G 4/06
(52) U.S. Cl. ...................... 361/303; 361/311; 257/303
(58) Field of Search ................................. 361/303–305, 361/306.1, 306.2, 311–312; 257/301, 303; 438/386

(56) References Cited

U.S. PATENT DOCUMENTS

| 5,372,962 A | * | 12/1994 | Hirota et al. ............... 438/398 |
| 5,618,746 A |   | 4/1997  | Hwang |
| 5,744,832 A | * | 4/1998  | Wolters et al. ............... 257/295 |
| 5,998,258 A | * | 12/1999 | Melnick et al. ............. 438/253 |
| 6,274,454 B1 |  | 8/2001  | Katori |
| 6,410,397 B1 | * | 6/2002 | Ochiai et al. ............... 438/381 |
| 6,421,223 B2 | * | 7/2002 | Marsh ...................... 361/306.3 |
| 2001/0025974 A1 |  | 10/2001 | Gealy et al. |
| 2003/0119251 A1 | * | 6/2003 | Aggarwal et al. .......... 438/239 |

FOREIGN PATENT DOCUMENTS

| EP | 1 130 628    |   | 9/2001 |            |
| JP | 5-226715     |   | 9/1993 |            |
| WO | WO00/01000   | * | 1/2000 | ........... H01L/21/02 |
| WO | 00/22658     |   | 4/2000 |            |

* cited by examiner

Primary Examiner—Eric W. Thomas
(74) Attorney, Agent, or Firm—Hamre, Schumann, Mueller & Larson, P.C.

(57) ABSTRACT

A capacitor element includes a lower electrode, a ferroelectric film, and an upper electrode that are formed on a substrate. In the capacitor element, the ferroelectric film is formed by a reaction rate-determining method, and the lower electrode has a thickness of not more than 100 nm, and variation of the thickness of not more than 10%. With this, a capacitor element in which the composition variation of the ferroelectric film is suppressed, and a method for producing the same, are provided.

19 Claims, 7 Drawing Sheets

CAPACITOR ELEMENT AND PRODUCTION THEREOF

BACKGROUND OF THE INVENTION

1. Field of the Invention

The present invention relates to a capacitor element and a method for producing the same in the case where a ferroelectric thin film is formed by a reaction rate-determining method. It particularly relates to a capacitor element capable of providing a ferroelectric memory (hereinafter referred to as FeRAM) that has smaller variation in characteristics on a lower electrode with a thickness of not more than 100 nm, and to a method for producing the same.

2. Related Background Art

A FeRAM is a non-volatile memory characterized by the high-speed rewriting and the increased writing times. The miniaturization of a memory cell thereof, particularly the miniaturization of a capacitor element composing a memory cell in a longitudinal direction (indicative of a thickness direction) and a transversal direction (indicative of a horizontal direction perpendicular to the thickness direction), has been demanded with the advancement of the integration. For the miniaturization, as to the longitudinal direction (thickness direction), it is necessary to make thinner a lower electrode, a ferroelectric thin film, and an upper electrode that compose a capacitor element. As to the transversal direction (horizontal direction), it is necessary to form the capacitor element three-dimensionally.

Thus, whether in the longitudinal direction or in the transversal direction, it is necessary to form films thinner. Therefore, for forming a ferroelectric thin film, it is essential to use a reaction rate-determining method with which the film thickness can be controlled so that the thickness decreases, for instance, the metal organic chemical vapor deposition (MOCVD) method. For instance, a method for producing a capacitor element for use in a DRAM in which a lower electrode (Ru) and a ferroelectric thin film (BST, i.e., (Ba, Sr)TiO$_3$) are formed by MOCVD has been disclosed (WO 00/22658).

However, the following phenomenon was found to occur in the case where a lower electrode is thinned so as to be not more than 100 nm in thickness: if a ferroelectric thin film is formed by a surface reaction rate-determining method such as MOCVD, the composition of the ferroelectric thin film varies with the thickness, due to the diffusion to the lower electrode of metal atoms that form the ferroelectric thin film.

To show an example of the same, the graph of FIG. 8 shows the film-thickness dependency of SBT (SrBi$_2$Ta$_2$O$_9$) formed as the ferroelectric thin film by MOCVD with respect to the film thickness of a Pt lower electrode, that is, the variation of the composition of SBT with respect to the thickness of the lower electrode. In FIG. 8, a solid circle indicates the Bi composition, while an empty circle indicates the Sr composition. As shown in FIG. 8, in a region where the lower electrode thickness is not less than 100 nm, the film thickness dependency of the composition of the ferroelectric thin film on the lower electrode is not seen, whereas in a region where the lower electrode thickness is less than 100 nm, the diffusion of the Bi metal atoms in the lower electrode Pt is saturated, whereby the Bi composition in the SBT increases with the decrease of the film thickness of the lower electrode. In other words, in the case where the lower electrode thickness varies in the capacitor element with a thickness of not more than 100 nm, the SBT composition also varies. As a result, the polarity characteristic of the capacitor element varies. It should be noted that "Standardized by Ta=2" regarding the vertical axis in FIG. 8 means that the composition ratio is re-calculated so that the elemental proportion of Ta$_2$ in SBT (SrBi$_2$Ta$_2$O$_9$) becomes 2. It should be noted that "Standardized by Ta=2" regarding the vertical axis in FIG. 4, which will be described later, means the same.

Further, to prevent the diffusion of metal atoms composing a ferroelectric thin film, a method whereby a metal oxide layer is arranged on a lower electrode (JP5-226715A) is disclosed. However, this makes the electrode structure complex and therefore raises a problem in the practical application.

SUMMARY OF THE INVENTION

Therefore, to solve the foregoing problems of the prior art, it is an object of the present invention to provide a capacitor element in which the composition variation of the ferroelectric thin film is suppressed, and a method for producing the same.

To achieve the foregoing object, a capacitor element of the present invention is a capacitor element composed of a lower electrode, a ferroelectric thin film, and an upper electrode that are formed on a substrate, wherein the ferroelectric thin film is formed by a reaction rate-determining method, and the lower electrode has a thickness of not more than 100 nm, and a variation in the thickness of not more than 10% (which means that any portion of the film has a thickness in a range of a predetermined value ±10% thereof).

A capacitor element producing method of the present invention includes: forming an insulation film on a substrate; forming a trench with a depth of not more than 100 nm in a part of the insulation film; forming a first conductive film on the insulation film, including inside of the trench; forming a lower electrode by polishing a surface of the first conductive film so that the first conductive film remains only in the inside of the trench; forming a ferroelectric thin film on the insulation film containing the lower electrode by a reaction rate-determining method; and forming an upper electrode on the ferroelectric thin film.

DETAILED DESCRIPTION OF THE INVENTION

Figure 1:
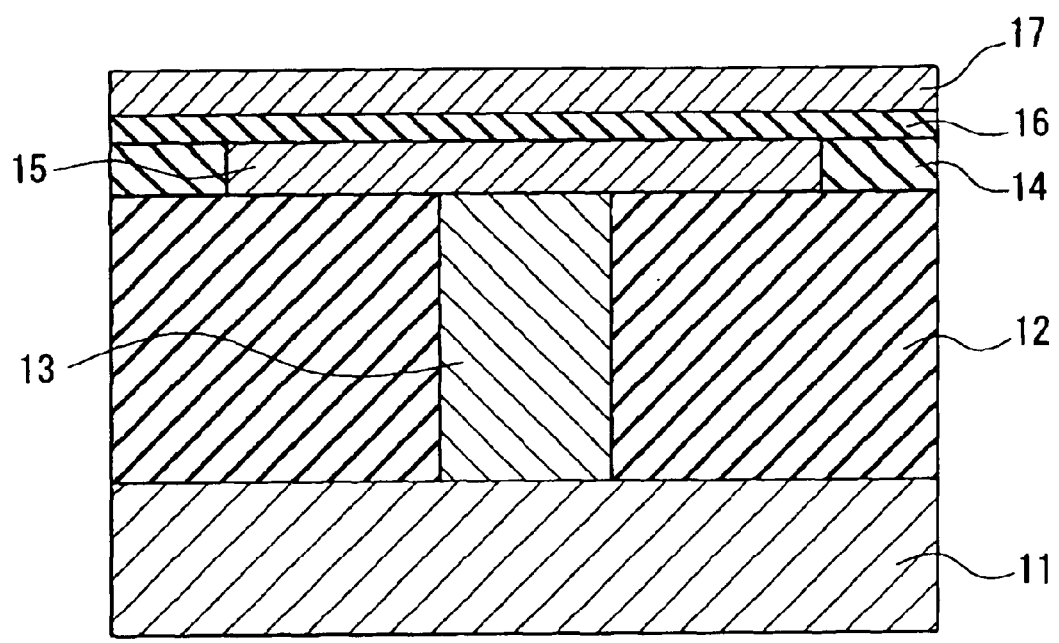
FIG. 1 is a cross-sectional view illustrating a capacitor element according to a first embodiment of the present invention.

The capacitor element of the present invention is composed of a ferroelectric thin film formed by a reaction rate-determining method, and the lower electrode has a thickness of not more than 100 nm, and a variation in the thickness of not more than 10%. The thickness of the lower electrode preferably is not less than 10 nm. That the lower electrode provided underneath has a thickness in the foregoing range means that the lower electrode is thin and uniform in thickness. This suppresses the composition variation of the ferroelectric thin film, thereby making it possible to provide a highly reliable capacitor element having a ferroelectric thin film that, when used for forming a FeRAM, is capable of suppressing the variation in characteristics of the FeRAM. More specifically, the thinness and uniformity in thickness of the lower electrode make it possible to suppress the composition variation of the ferroelectric thin film, thereby suppressing the variation in capacitor element characteristics.

Further, a lower electrode in a projected shape or in a recessed shape may be formed on the substrate. This configuration makes it possible to provide a highly reliable capacitor element that, when used for forming a FeRAM, is capable of suppressing the variation in characteristics of the FeRAM due to the composition variation of the ferroelectric thin film, even if it is in a three-dimensional shape suitable for the size reduction in the transversal direction.

Further, in the capacitor element of the present invention, the lower electrode preferably is formed on a conductive multilayer film containing a metal oxide. This configuration makes it possible to suppress the variation in characteristics of a FeRAM due to the composition variation of the ferroelectric thin film, while incorporating an oxide barrier film. More specifically, the presence of the barrier film prevents a conductive member such as a contact plug from being oxidized upon a heat treatment for forming a ferroelectric thin film. Therefore, in the case where the capacitor element is used for forming a FeRAM while the conductivity thereof thus is prevented from decreasing, it is possible to provide a more highly reliable capacitor element that is capable of suppressing with the variation in characteristics of the FeRAM Further, in the capacitor element of the present invention, the ferroelectric thin film preferably contains Bi. In the ferroelectric thin film containing Bi, the composition variation of the ferroelectric thin film due to the Bi component or the like is suppressed. Therefore, it is possible to provide a highly reliable capacitor element having a ferroelectric thin film that, when used for forming a FeRAM, is capable of suppressing the variation in characteristics of the FeRAM.

Further, in the capacitor element of the present invention, the lower electrode in contact with the ferroelectric thin film preferably is composed of a film containing a rare metal. The film containing a rare metal is not oxidized in a heat treatment during the process for producing the capacitor element, and has a stable interface resistance even in the case where it is provided in contact with a ferroelectric. Therefore, a capacitor element with excellent electric characteristics can be provided. The film containing a rare metal preferably is at least one film made of platinum (Pt), iridium (Ir), ruthenium (Ru), gold (Au), silver (Ag), and palladium (Pd), respectively, films made of alloys containing these, and films made of oxides containing these.

Still further, according to the method of the present invention for producing a capacitor element, a lower electrode with a thickness of not more than 100 nm can be formed without thickness variation. Therefore, the composition variation of a ferroelectric thin film is suppressed, whereby it is possible to provide a highly reliable capacitor element having a ferroelectric thin film that, when used for forming a FeRAM, is capable of suppressing the variation in characteristics of the FeRAM.

Still further, the method of the present invention for producing a capacitor element preferably includes: forming an insulation film on a substrate; forming a trench with a depth of not more than 100 nm in a part of the insulation film; forming a first conductive film on the insulation film, including inside of the trench; forming a lower electrode by polishing a surface of the first conductive film so that the first conductive film remains only in the inside of the trench; forming a ferroelectric thin film on the insulation film containing the lower electrode by a reaction rate-determining method; and forming an upper electrode on the ferroelectric thin film. This configuration makes it possible to form the lower electrode with a thickness of not less than 10 nm and not more than 100 nm without thickness variation even in the case where the lower electrode is in a three dimensional shape suitable for the size reduction in the transversal direction. This makes it possible to provide a method for producing a highly reliable capacitor element having a ferroelectric thin film that, when used for forming a FeRAM, is capable of suppressing the variation in characteristics of the FeRAM.

Still further, in the method of the present invention for producing a capacitor element, the lower electrode preferably is formed on a plurality of the trenches. This configuration makes it possible to provide the lower electrode with a thickness of not less than 10 nm and not more than 100 nm without thickness variation, as well as to increase the capacity area of the three-dimensional capacitor element.

Still further, in the method of the present invention for producing a capacitor element, the lower electrode preferably is formed on a conductive multilayer film containing a metal oxide. This configuration makes it possible to provide a lower electrode with a thickness of not less than 10 nm and not more than 100 nm without thickness variation, as well as with the oxidation barrier property. More specifically, the presence of the barrier film prevents a conductive member such as a contact plug from being oxidized upon a heat treatment for forming a ferroelectric thin film. Therefore, in the case where the capacitor element is used for forming a FeRAM while the conductivity thereof thus is prevented from decreasing, it is possible to provide a more highly reliable capacitor element that is capable of suppressing with the variation in characteristics of the FeRAM due to the composition variation of the ferroelectric thin film.

Still further, in the method of the present invention for producing a capacitor element, the ferroelectric thin film preferably is a ferroelectric thin film containing Bi. This configuration makes it possible to, in the ferroelectric thin film containing Bi, suppress the composition variation of the ferroelectric thin film due to the Bi component or the like. Therefore, it is possible to provide a method for producing a highly reliable capacitor element having a ferroelectric thin film that, when used for forming a FeRAM, is capable of suppressing the variation in characteristics of the FeRAM.

The purpose of setting the thickness of the lower electrode to not less than 10 nm and not more than 100 nm in the present invention is to contribute to the miniaturization and high integration of the capacitor element, and at the same time, it is also preferable since the reduction of the thickness causes stress (stress due to deformation) due to a difference in the materials of adjacent layers to decrease. Though not directly relating to the present invention, a lower limit of the thickness of the lower electrode is not limited particularly, and the thickness may be not less than a minimum level that allows the lower electrode to function as an electrode.

The film formation by the reaction rate-determining method is a method in which, in the case where a film is formed by depositing a specific material on a certain substrate (equivalent to the lower electrode in the present invention), a material gas that is to form a film as a result of reaction is supplied onto a substrate, and causes reaction on a surface of the substrate, whereby a reaction product is deposited on the substrate and forms a film. Therefore, this is a film forming method in which the film forming rate is equal to a rate determined by the reaction rate of the material gas, that is, a method whereby a film of the reaction product is formed on the substrate as a result of the reaction of the material gas on the substrate. In the present invention, the above-described MOCVD is preferable as the reaction rate-determining method. Examples of film forming methods other than the reaction rate-determining method include film forming methods in which a material prepared preliminarily by reaction is deposited on a substrate, for instance, sputtering, and the sol-gel process typically. Preferable conditions for the MOCVD method are a film forming temperature in a range of 300° C. to 450° C., and a pressure in a range of 13.3 Pa to 665 Pa (0.1 Torr to 5 Torr). The reason why the ferroelectric thin film preferably is formed by MOCVD is that this facilitates control of the formation of a thin-film lower electrode with a thickness of not less than 10 nm and not more than 100 nm.

As described above, with the configuration of the capacitor element of the present invention, it is possible to provide a highly reliable capacitor element that is capable of suppressing the variation in characteristics of a FeRAM. Further, the method of the present invention for producing a capacitor element is capable of forming the lower electrode with a uniform thickness of not less than 10 nm and not more than 100 nm. Therefore, the composition variation of a ferroelectric thin film is suppressed, and as a result, it is possible to provide a method for producing a highly reliable capacitor element having a ferroelectric thin film that, when used for forming a FeRAM, is capable of suppressing the variation in characteristics of the FeRAM.

EXAMPLES

The following will describe the present invention in more detail while referring to specific embodiments, so as to make the present invention understood more easily. However, the present invention is not limited to the embodiments described below.

First Embodiment

The following will describe a first embodiment of the present invention while referring to the drawings. FIG. 1 is a cross-sectional view illustrating a capacitor element according to the first embodiment. 11 denotes a Si substrate. 12 denotes an insulation film such as a silicon oxide film. 13 denotes a contact plug made of polysilicon (PS), tungsten (W), or the like. 14 denotes an insulation film such as a silicon oxide film or the like. 15 denotes a lower electrode made of Pt. 16 denotes a ferroelectric thin film made of SBT ($SrBi_2Ta_2O_9$). 17 denotes an upper electrode made of Pt. The lower electrode 15 is subjected to thickness control so that the thickness thereof is 50 nm and the thickness variation thereof is within 10%. By controlling the thickness of the lower electrode, in the case where the ferroelectric thin film 16 is formed by MOCVD, an amount of Bi metal diffused into the Pt lower electrode 15, out of the Bi metal forming the ferroelectric thin film 16, can be controlled within the capacitor element as well as between the capacitor elements. As a result, it is possible to suppress the variation of the capacitor element characteristics.

FIGS. 2A to 2E are cross-sectional views illustrating a method for producing the capacitor element according to the first embodiment shown in FIG. 1. In FIGS. 2A to 2E that illustrate principal steps of the foregoing method, 11 denotes a Si substrate. 12 denotes an insulation film such as a silicon oxide film. 13 denotes a contact plug made of polysilicon (PS), tungsten (W) or the like. 14 denotes an insulation film such as a silicon oxide film. 25 denotes a trench formed in the insulation film 14. 15 denotes a lower electrode made of Pt. 16 denotes a ferroelectric thin film made of SBT. 17 denotes an upper electrode made of Pt.

Figure 2A:
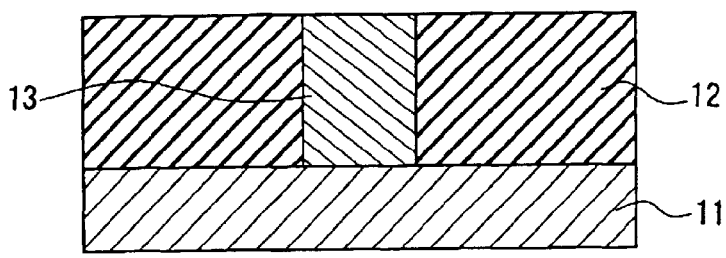
FIGS. 2A to 2E are cross-sectional views illustrating steps of a process for producing a capacitor element according to the first embodiment of the present invention.
Figure 2B:
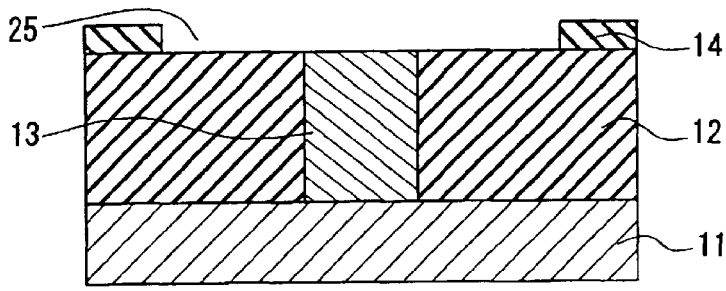
Figure 2C:
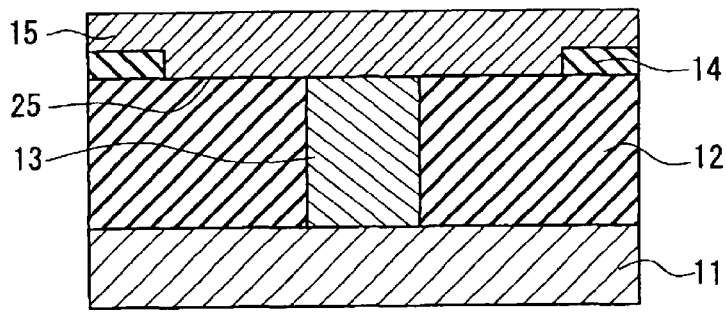
Figure 2D:
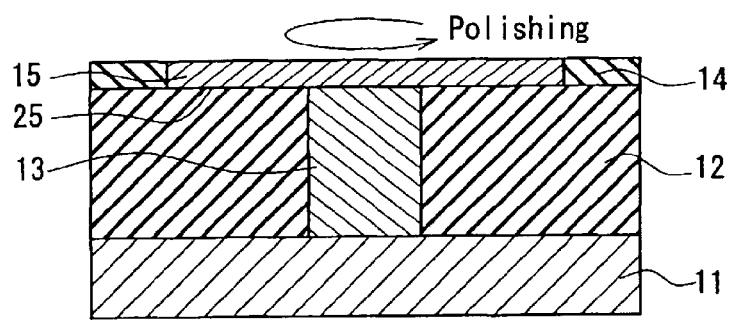
Figure 2E:
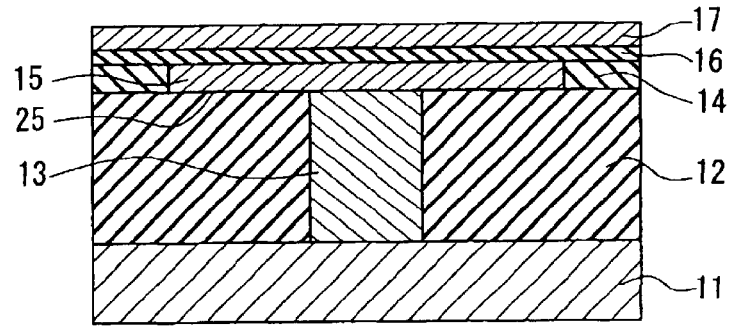

First, the contact plug 13 is embedded in the insulation film 12 that is formed on the Si substrate 11 and in which an integrated circuit is formed (FIG. 2A). Secondly, the insulation film 14 with a thickness of not more than 50 nm is formed by deposition, and thereafter, the trench 25 with a depth of 50 nm is formed by photolithography and dry-etching (photolithography and dry-etching used in a normal manufacturing method for semiconductor devices) in a region where the lower electrode is to be formed (FIG. 2B). Thirdly, the lower electrode 15 is embedded in the trench 25 by sputtering, CVD, or plating (FIG. 2C). Fourthly, the lower electrode 15 is polished by chemical-mechanical polishing (CMP) or the like, so that the lower electrode 15 is embedded in the trench 25 (FIG. 2D). Finally, after depositing the ferroelectric thin film 16 by MOCVD, the upper electrode 17 is formed by sputtering, CVD, or plating (FIG. 2E). It should be noted that in the example described above, conditions under which the ferroelectric thin film 16 is deposited by MOCVD are such that $BiPh_3$ and $Sr[Ta(OEt)_5(OC_2H_4OMe)]_2$ (where Ph, Et, and Me indicate a phenyl group, an ethyl group, and a methyl group, respectively) are used as materials, the temperature is 300° C. to 600° C., and the pressure is 13.33 Pa (0.1 Torr) to 1333 Pa (10 Torr).

In the present embodiment, the thickness of the lower electrode 15 is controlled by the depth of the trench 25. On the other hand, since the depth of the trench 25 is controlled according to the thickness of the insulation film 14, the thickness is achieved with a variation of not more than 10% by the method of film formation for forming the insulation film 14 (photolithography and dry etching). In other words, the lower electrode 15 is provided with a thickness of not more than 100 nm with variation thereof of not more than 10%.

Consequently, a capacitor element is obtained with smaller variation of the SBT composition and smaller variation of capacitor element characteristics.

Second Embodiment

Next, the following will describe a second embodiment of the present invention, while referring to the drawings.

Figure 3:
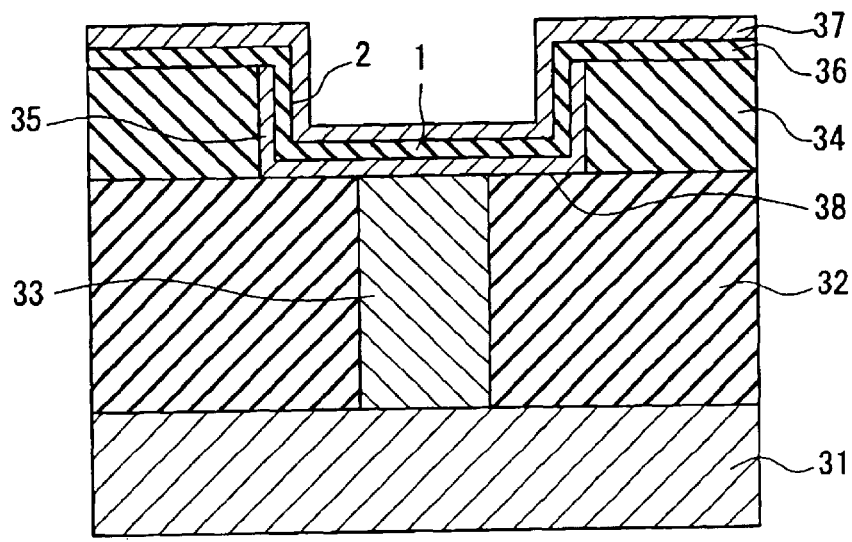
FIG. 3 is a cross-sectional view illustrating a capacitor element according to a second embodiment of the present invention.

FIG. 3 is a cross-sectional view illustrating a capacitor element of the present invention. In FIG. 3, 31 denotes a Si substrate. 32 denotes an insulation film such as a silicon oxide film. 33 denotes a contact plug made of polysilicon (PS), tungsten (W), or the like. 34 denotes an insulation film such as a silicon oxide film. 35 denotes a lower electrode made of Pt. 36 denotes a ferroelectric thin film made of SBT. 37 denotes an upper electrode made of Pt. 38 denotes a recess with a depth of 300 nm.

A method for producing the capacitor element shown in FIG. 3 is substantially identical to the method according to the first embodiment, which is described as above with reference to FIGS. 2A to 2E, except for a part of the steps. The differences are that the recess 38 is formed relatively deeper, and that the lower electrode 35 does not fill the recess 38, but is formed by sputtering or CVD on a bottom portion 1 and side portions 2 of the recess 38, as well as a top face of the insulation film 34, along the shape of the recess 38 and the insulation film 34.

In FIG. 3, the lower electrode 35 has a thickness of not more than 100 nm with a variation of not more than 10%. By thus controlling the thickness of the lower electrode, in the case where the ferroelectric thin film 36 is formed by MOCVD, an amount of Bi metal diffused into the Pt lower electrode 35, out of the Bi metal forming the ferroelectric thin film 36, can be controlled within the capacitor element as well as between the capacitor elements. As a result, it is possible to suppress the variation of the capacitor element characteristics.

Actually, the thickness of the lower electrode 35 made of Pt was set to be 50±2 nm (variation of the thickness: 8%), and the ferroelectric thin film 36 made of SBT was formed by MOCVD at a temperature of 450° C. so as to have a thickness of 60 nm. Thereafter, the upper electrode 37 was formed by depositing Pt to a thickness of 50 nm, and a rapid thermal anneal (RTA) up to 800° C. for 1 min was conducted. Here, RTA is a treatment of heating at a temperature rising rate of 10° C./s to 100° C./s up to a temperature of 600° C. to 800° C.

Figure 4:
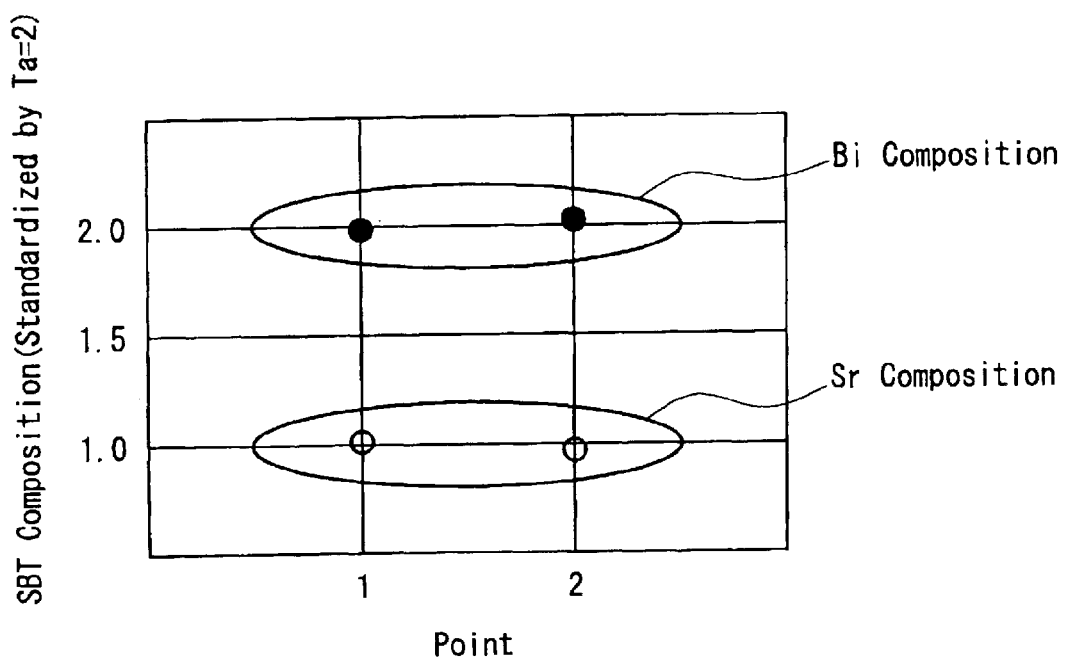
FIG. 4 is a graph illustrating compositions of SBT of a ferroelectric thin film at specific measurement points.

FIG. 4 is a graph showing the result of measurement of the composition of the ferroelectric thin film 36 at a point 1 (on the bottom face of the recess) and at a point 2 (on the side face of the recess) shown in FIG. 3. In FIG. 4, a solid circle indicates the Bi composition, while an empty circle indicates the Sr composition. It is seen from FIG. 4 that, since the thickness of the lower electrode 35 was controlled so that the variation thereof was 8%, the Bi composition exhibited substantially no variation, and was controlled to have an elemental proportion of substantially 2.0, as expressed by the chemical composition of SBT ($SrBi_2Ta_2O_9$).

Third Embodiment

The following will describe a third embodiment of the present invention, while referring to the drawings.

Figure 5:
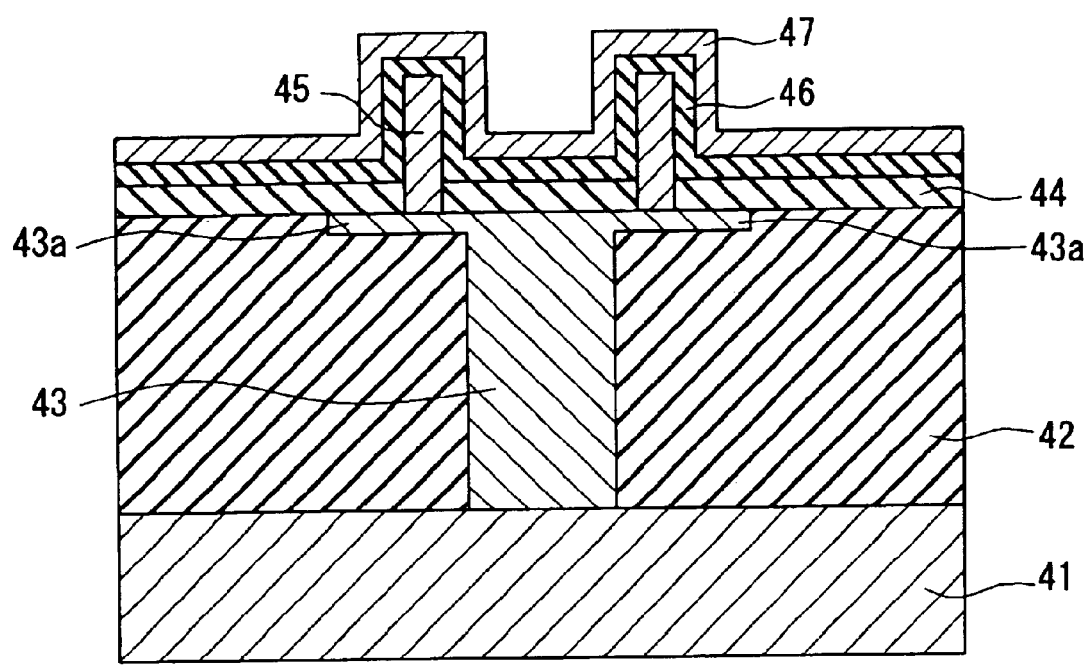
FIG. 5 is a cross-sectional view illustrating a capacitor element according to a third embodiment of the present invention.

FIG. 5 is a cross-sectional view of a capacitor element of the present invention. In FIG. 5, 41 denotes a Si substrate. 42 denotes an insulation film such as a silicon oxide film. 43 denotes a contact plug made of polysilicon (PS), tungsten (W), or the like. 43a denotes an upper extension part of the contact plug 43. 44 denotes an insulation film such as a silicon oxide film. 45 denotes a lower electrode made of Pt. 46 denotes a ferroelectric thin film made of SBT. 47 denotes an upper electrode made of Pt.

In FIG. 5, the lower electrode 45 has a width of 40 nm, with variation in the width being controlled to be not more than 10%. In the case where the lower electrode is spread not in a horizontal direction as shown in FIG. 1 but in a vertical direction as shown in FIG. 5, the width of the lower electrode 45 as described above indicates a thickness of the electrode. By controlling the thickness of the lower electrode, in the case where the ferroelectric thin film 46 is formed by MOCVD, an amount of Bi metal diffused into the Pt lower electrode 45, out of the Bi metal forming the ferroelectric thin film 46, can be controlled within the capacitor element as well as between the capacitor elements. As a result, it is possible to suppress the variation of the capacitor element characteristics.

FIGS. 6A to 6F are cross-sectional views illustrating steps of a process for manufacturing a capacitor element of the present invention shown in FIG. 5. In FIGS. 6A to 6F illustrating principal steps of the manufacturing process, 41 denotes a Si substrate. 42 denotes an insulation film such as a silicon oxide film. 43 denotes a contact plug made of polysilicon (PS), tungsten (W), or the like. 43a denotes an upper extension portion of the contact plug 43. 44 denotes an insulation film such as a silicon oxide film. 55 denotes a trench formed in the insulation film 44. 45 denotes a lower electrode made of Pt. 46 denotes a ferroelectric thin film made of SBT. 47 denotes an upper electrode made of Pt.

Figure 6A:
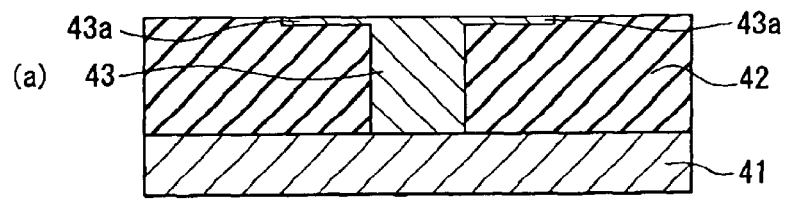
FIGS. 6A to 6F are cross-sectional views illustrating steps of a process for producing a capacitor element according to the third embodiment of the present invention.
Figure 6B:
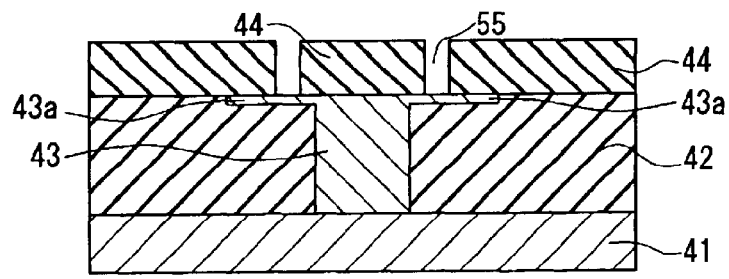
Figure 6C:
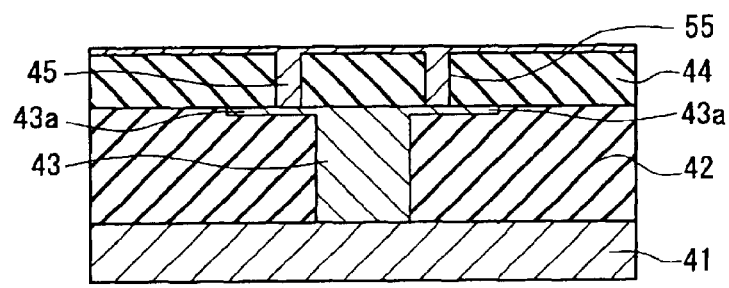
Figure 6D:
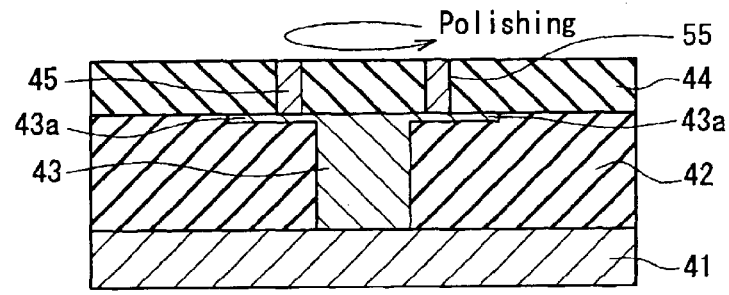
Figure 6E:
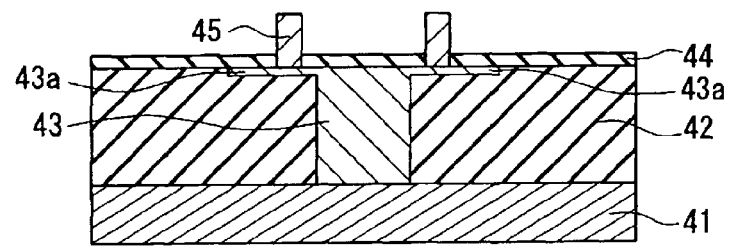
Figure 6F:
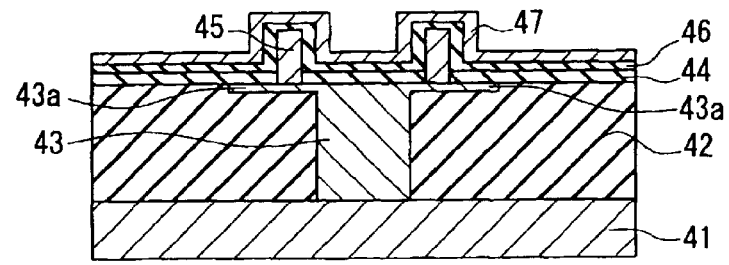

First of all, the contact plug 43 is embedded in the insulation film 42 that is formed on the Si substrate 41 and in which an integrated circuit is formed (FIG. 6A). Secondly, after the insulation film 44 is formed by deposition, the trenches 55, each of which has a width of not more than 100 nm, are formed by photolithography and dry-etching in a region where the lower electrode is to be formed (FIG. 6B). The trench 55 with a width of 40 nm is formed as the trench having a width in a transversal direction of not more than 100 nm shown in FIG. 6B. In this case, a plurality of the trenches 55 are formed so that bottoms of the trenches 55 are in contact with the upper extension portions 43a of the contact plug 43. Thirdly, the lower electrode 45 is embedded in the trenches 55 by sputtering, CVD, or plating (FIG. 6C). Fourthly, the lower electrode 45 is polished by chemical-mechanical polishing (CMP) or the like, so that the lower electrode 45 is embedded in the trenches 55 (FIG. 6D). Fifthly, a part of the insulation film 44 around the lower electrode 45 is removed by dry etching or wet etching, so that the lower electrode 45 partially is exposed so as to project out (FIG. 6E). Finally, after depositing the ferroelectric thin film 46 by MOCVD over an entirety of upper surfaces, the upper electrode 17 is formed further thereon (FIG. 6F). It should be noted that in the example described above, conditions under which the ferroelectric thin film 46 is deposited by MOCVD are such that $BiPh_3$ and $Sr[Ta(OEt)_5(OC_2H_4OMe)]_2$ (where Ph, Et, and Me indicate a phenyl group, an ethyl group, and a methyl group, respectively) are used as materials, the temperature is 300° C. to 600° C., and the pressure is 13.33 Pa (0.1 Torr) to 1333 Pa (10 Torr).

According to the present embodiment, the width of the lower electrode 45 is equivalent to the thickness of the lower electrode, and the width thereof is controlled according to the width of the trench 55. On the other hand, since the width of the trench 55 is formed by a technique used in a normal method for producing a semiconductor device, such as photolithography and dry-etching with respect to the insulation film 44, the reduction of the variation of the width to not more than 10% can be achieved easily. More specifically, the lower electrode 56 with a width of not more than 100 nm and the variation of not more than 10% can be achieved easily. Consequently, a capacitor element with smaller variation of the SBT composition and smaller variation of the capacitor element characteristics is obtained. Further, the capacitor element obtained is in a three-dimensional form, whereby a capacitance area of the capacitor element is increased.

Fourth Embodiment

Figure 7:
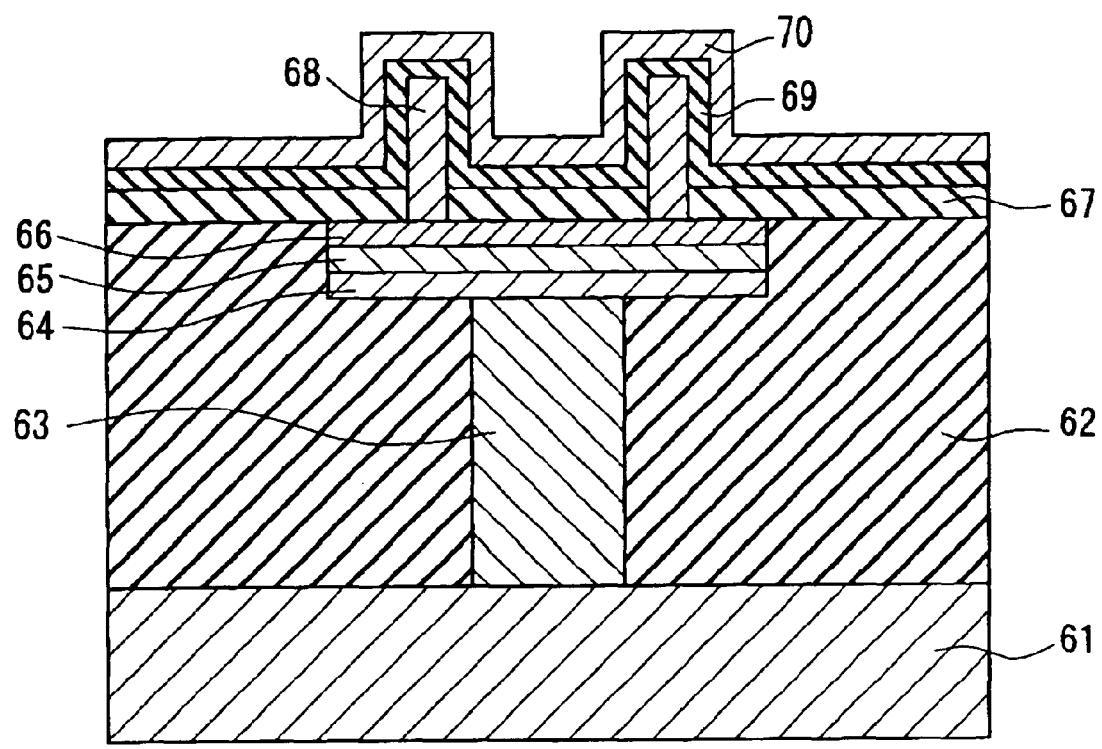
FIG. 7 is a cross-sectional view illustrating a capacitor element according to a fourth embodiment of the present invention.
Figure 8:
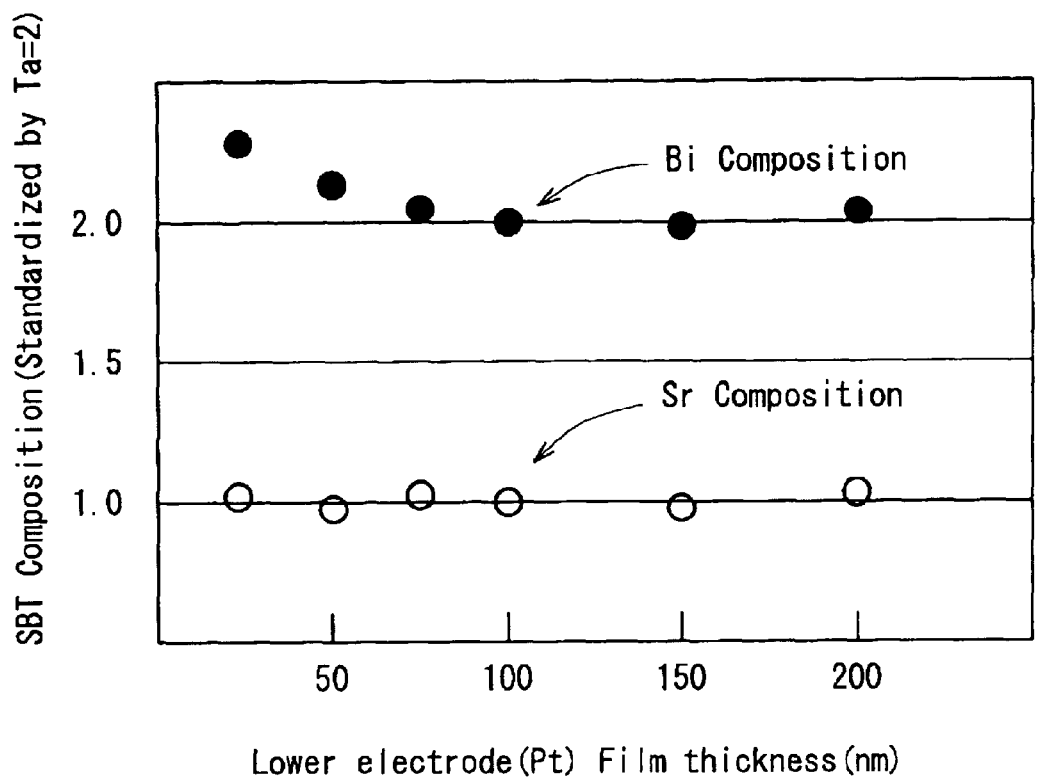
FIG. 8 is a graph illustrating variation of a composition of SBT (SrBi$_2$Ta$_2$O$_9$) with the thickness of the lower electrode.

The following will describe a fourth embodiment of the present invention, while referring to the drawings. FIG. 7 is a cross-sectional view of a capacitor element of the present invention. In FIG. 7, 61 denotes a Si substrate. 62 denotes an insulation film such as a silicon oxide film. 63 denotes a contact plug made of polysilicon (PS), tungsten (W), or the like. 64 denotes a first barrier metal made of TiAlN. 65 denotes a second barrier metal made of Ir. 66 denotes a metal oxide film made of IrO. 67 denotes an insulation film such as a silicon oxide film. 68 denotes a lower electrode made of Pt. 69 denotes a ferroelectric thin film made of SBT. 70 denotes an upper electrode made of Pt.

A method for manufacturing the capacitor element shown in FIG. 7 is substantially similar to the method according to the third embodiment described above with reference to FIGS. 6A to 6F except for a part of the steps. The differences are that as compared with the case of FIGS. 6A to 6F in which upper extension portions 43*a* of the contact plug 43 are present, the upper extension portions 43*a* are replaced with a conductive multilayer film containing a metal oxide, which is composed of the first barrier metal 64 made of TiAlN, the second barrier metal 65 made of Ir, and the metal oxide film 66 made of IrO, and hence, that the step for forming the conductive multilayer film is included in the manufacturing process. It should be noted that the first barrier metal 64 made of TiAlN is formed by sputtering or MOCVD, the second barrier metal 65 made of Ir is formed by sputtering or MOCVD, and the metal oxide film 66 made of IrO is formed by sputtering or MOCVD.

In FIG. 7, since the lower electrode 68 is formed on the conductive multilayer film containing a metal oxide, that is, the three oxidation barrier layers (64, 65, 66), the diffusion of oxygen to the contact plug 63 upon the crystallization of the ferroelectric thin film 69 can be prevented completely. Therefore, the oxidation of the contact plug 63 is prevented, whereby the contact resistance between the contact plug 63 and the lower electrode 68 can be stabilized.

Furthermore, the lower electrode 68 is controlled so as to have a width of not more than 100 nm and width variation of not more than 10%, by the same method as that of the third embodiment. Thus, by controlling the film thickness of the lower electrode, in the case where the ferroelectric thin film 69 is formed by MOCVD, an amount of Bi metal diffused into the Pt lower electrode 68, out of the Bi metal forming the ferroelectric thin film 69, can be controlled within the capacitor element as well as among the capacitor elements. As a result, it is possible to suppress the variation of the capacitor element characteristics.

Further, the capacitor element obtained is in a three-dimensional form, whereby a capacity area of the capacitor element is increased.

It should be noted that in the first through fourth embodiments, the lower electrode may be formed with a film containing at least one rare metal, which is selected from films made of platinum (Pt), iridium (Ir), ruthenium (Ru), gold (Au), silver (Ag), and palladium (Pd), respectively, films made of alloys containing these, and films made of oxides containing these.

Further, SBT is used for forming the ferroelectric thin film, but another material may be used, for instance, a material containing Bi, such as SBT doped with Nb or another metal, or $(Bi_{4-X}, La_X)Ti_3O_{12}$ (where X satisfies $0.25 \leq X \leq 1.25$), or alternatively, a material containing Pb, such as $(Pb, Zr)TiO_3$.

The first barrier metal 64, the second barrier metal 65, and the metal oxide film 66 of the fourth embodiment may be provided under the lower electrode according to the first or second embodiment.

Still further, the materials of the first barrier metal 64, the second barrier metal 65, and the metal oxide film 66 are not limited to TiAlN, Ir, and IrO, respectively, and they may be other oxygen barrier materials or hydrogen barrier materials.

Still further, the configuration is not limited to the three-layer configuration composed of the first barrier metal 64, the second barrier metal 65, and the metal oxide film 66. It may be composed of two layers or less, or four layers or more.

It should be noted that the first to fourth embodiments are described with reference to cases in which a semiconductor substrate is used as a substrate, but the embodiments are not limited to the cases where the capacitor element is formed on a semiconductor substrate as long as the capacitor element is a capacitor element employing a ferroelectric thin film, and the embodiments are applicable also in the case where the capacitor element is formed on another substrate.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A capacitor element composed of a lower electrode, a ferroelectric film, containing Bi, and an upper electrode that are formed on a substrate, the ferroelectric film being formed on the lower electrode, wherein the ferroelectric film is formed by a reaction rate-determining method and has a chemical composition with a substantially constant elemental proportion, the lower electrode has a thickness of not more than 100 nm, and variation of the thickness of not more than 10% and, a Bi content of the ferroelectric film formed on the lower electrode exhibits substantially no variation.

2. The capacitor element according to claim 1, wherein the ferroelectric film is made of at least one material selected from the group consisting of SBT ($SrBi_2Ta_2O_9$), SBT doped with a metal of Nb, $(Bi_{4-X}, La_X)Ti_3O_{12}$ (where X satisfies $0.25 \leq X \leq 1.25$), and $(Pb, Zr)TiO_3$.

3. The capacitor element according to claim 1, wherein the reaction rate-determining method is a metal organic chemical vapor deposition (MOCVD) method.

4. The capacitor element according to claim 1, wherein the lower electrode is formed in a recessed shape.

5. The capacitor element according to claim 1, wherein the lower electrode is formed on a conductive multilayer film containing metal oxide.

6. The capacitor element according to claim 1, wherein the lower electrode in contact with the ferroelectric film contains a rare metal.

7. The capacitor element according to claim 6, the lower electrode containing the rare metal is at least one film selected from the group consisting of films selected from the group consisting of platinum (Pt), iridium (Ir), ruthenium (Ru), gold (Au), silver (Ag), and palladium (Pd), films made of alloys containing these, and films made of oxides containing these.

8. The capacitor element according to claim 1, wherein the lower electrode is formed in a projected shape.

9. The capacitor element according to claim 1, wherein the lower electrode is formed in a columnar shape that extends in a vertical direction.

10. The capacitor element according to claim 1, further comprising an insulating film adjacent the lower electrode, the lower electrode having a planar upper surface, the insulating film having an upper surface that is substantially co-planar with the upper surface of the lower electrode, the ferroelectric film being formed on the insulating film and the lower electrode.

11. A method for producing a capacitor element comprising:
forming an insulation film on a substrate;
forming a trench with a depth of not more than 100 nm in a part of the insulation film;
forming a first conductive film on the insulation film, including inside of the trench;
forming a lower electrode by polishing a surface of the first conductive film so that the first conductive film remains only in the inside of the trench;
forming a ferroelectric film containing Bi on the insulation film and the lower electrode by a reaction rate-determining method; and
forming an upper electrode on the ferroelectric film,
wherein the lower electrode has a thickness of not more than 100 nm and variation of the thickness of not more than 10%, and
a Bi content of the ferroelectric film formed on the lower electrode exhibits substantially no variation.

12. The method according to claim 11, further comprising:
removing a part of the insulation film so as to expose at least a part of the lower electrode above the insulation film, the removal being carried out between the lower electrode formation and the ferroelectric film formation.

13. The method according to claim 11,
wherein the lower electrode is formed on a plurality of the trenches.

14. The method according to claim 11,
wherein the lower electrode is formed on a conductive multilayer film containing a metal oxide.

15. The method according to claim 11,
wherein the ferroelectric film is made of at least one material selected from SBT ($SrBi_2Ta_2O_9$), SBT doped with a metal of Nb, ($Bi_{4-X}$, $La_X$)$Ti_3O_{12}$ (where X satisfies $0.25 \leq X \leq 1.25$), and (Pb, Zr)$TiO_3$.

16. The method according to claim 11,
wherein the reaction rate-determining method is a metal organic chemical vapor deposition (MOCVD) method.

17. The method according to claim 11,
wherein the lower electrode is formed in a projected shape or a recessed shape.

18. The method according to claim 11,
wherein the lower electrode in contact with the ferroelectric film contains a rare metal.

19. The method according to claim 18,
wherein the lower electrode containing the rare metal is at least one film selected from the group consisting of films selected from the group consisting of platinum (Pt), iridium (Ir), ruthenium (Ru), gold (Au), silver (Ag), and palladium (Pd), respectively, films made of alloys containing these, and films made of oxides containing these.

* * * * *